US012570520B2

(12) United States Patent
Qian et al.

(10) Patent No.: US 12,570,520 B2
(45) Date of Patent: Mar. 10, 2026

(54) CANTILEVERED PIEZOELECTRIC MICROELECTROMECHANICAL SYSTEMS MICROPHONE WITH STRESS COMPENSATION

(71) Applicant: SKYWORKS SOLUTIONS, INC., Irvine, CA (US)

(72) Inventors: You Qian, Singapore (SG); Rakesh Kumar, Singapore (SG); Guofeng Chen, Fremont, CA (US)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 913 days.

(21) Appl. No.: 17/810,871

(22) Filed: Jul. 6, 2022

(65) Prior Publication Data

US 2023/0012046 A1 Jan. 12, 2023

Related U.S. Application Data

(60) Provisional application No. 63/220,031, filed on Jul. 9, 2021.

(51) Int. Cl.
| | |
|---|---|
| *B81B 3/00* | (2006.01) |
| *B81C 1/00* | (2006.01) |
| *H04R 17/02* | (2006.01) |

(52) U.S. Cl.
CPC .......... B81B 3/0072 (2013.01); B81C 1/0015 (2013.01); H04R 17/02 (2013.01); (Continued)

(58) Field of Classification Search
CPC ...... H04R 17/02; H04R 31/003; H04R 31/00; H04R 2201/003; B81B 3/0072; (Continued)

(56) References Cited

U.S. PATENT DOCUMENTS

| | | | |
|---|---|---|---|
| 8,948,419 | B2 | 2/2015 | Zhang |
| 9,055,372 | B2 | 6/2015 | Grosh et al. |

(Continued)

FOREIGN PATENT DOCUMENTS

| | | |
|---|---|---|
| CN | 107128870 A | 9/2017 |
| EP | 3557881 A1 | 10/2019 |

(Continued)

OTHER PUBLICATIONS

Knisely et al., "Method for Controlling Stress Gradients in PVD Aluminum Nitride", Journal of Micromechanics and Microengineering, vol. 28, No. 11, 2018.

(Continued)

*Primary Examiner* — Emily P Pham
(74) *Attorney, Agent, or Firm* — Lando & Anastasi, LLP

(57) ABSTRACT

A piezoelectric microelectromechanical systems (MEMS) microphone is provided comprising a substrate including walls defining a cavity and at least one of the walls defining an anchor region, a piezoelectric film layer supported by the substrate at the anchor region such that the piezoelectric film layer is cantilevered, the piezoelectric film layer being formed to introduce differential stress between a front surface of the piezoelectric film layer oriented away from the cavity and a back surface of the piezoelectric film layer oriented towards the cavity such that the piezoelectric film layer is bent into the cavity, and an electrode disposed over the piezoelectric film layer and adjacent the anchor region. A method of manufacturing such a MEMS microphone is also provided.

13 Claims, 12 Drawing Sheets

(52) U.S. Cl.
CPC ................. *B81B 2201/0257* (2013.01); *B81B 2203/0118* (2013.01); *B81B 2203/0307* (2013.01); *B81B 2203/0315* (2013.01); *B81B 2203/04* (2013.01); *B81C 2201/0132* (2013.01); *B81C 2201/014* (2013.01); *H04R 2201/003* (2013.01)

(58) Field of Classification Search
CPC ..... B81B 2201/0257; B81B 2203/0118; B81B 2203/0307; B81B 2203/0315; B81B 2203/04; B81C 1/0015; B81C 2201/0132; B81C 2201/014
See application file for complete search history.

(56) References Cited

U.S. PATENT DOCUMENTS

| | | | |
|---|---|---|---|
| 9,832,573 | B2 | 11/2017 | Hall et al. |
| 9,902,612 | B2 | 2/2018 | Dehe et al. |
| 10,626,007 | B2 | 4/2020 | Bretthauer et al. |
| 10,964,880 | B2 | 3/2021 | Grosh et al. |
| 2008/0123878 | A1 | 5/2008 | Zhe et al. |
| 2009/0092273 | A1 | 4/2009 | Zhe et al. |
| 2011/0051985 | A1 | 3/2011 | Hwang et al. |
| 2013/0121509 | A1 | 5/2013 | Hsu et al. |
| 2016/0219374 | A1 | 7/2016 | Hall et al. |
| 2016/0219375 | A1 | 7/2016 | Hall et al. |
| 2017/0085994 | A1 | 3/2017 | Clerici et al. |
| 2017/0186940 | A1 | 6/2017 | Bevilacqua et al. |
| 2018/0091905 | A1 | 3/2018 | Clerici et al. |
| 2018/0299335 | A1 | 10/2018 | Wong et al. |
| 2019/0281393 | A1 | 9/2019 | Grosh et al. |
| 2019/0327562 | A1 | 10/2019 | Cerini et al. |
| 2020/0148532 | A1 | 5/2020 | Grosh et al. |
| 2020/0351595 | A1 | 11/2020 | Rusconi Clerici Beltrami et al. |
| 2020/0382876 | A1 | 12/2020 | Cerini et al. |
| 2021/0051413 | A1 | 2/2021 | Hui et al. |
| 2021/0067880 | A1* | 3/2021 | Cheng ................... H04R 17/02 |
| 2021/0084423 | A1 | 3/2021 | Rusconi Clerici Beltrami et al. |
| 2021/0120346 | A1 | 4/2021 | Hui et al. |
| 2021/0136483 | A1 | 5/2021 | Hsieh et al. |
| 2021/0385584 | A1 | 12/2021 | Goswami et al. |
| 2022/0073342 | A1 | 3/2022 | Ho et al. |
| 2022/0267141 | A1 | 8/2022 | Chen et al. |
| 2022/0272459 | A1 | 8/2022 | Chen et al. |
| 2022/0332568 | A1 | 10/2022 | Barsukou |
| 2022/0402752 | A1 | 12/2022 | Goswami et al. |
| 2023/0007405 | A1 | 1/2023 | Qian et al. |
| 2023/0011561 | A1 | 1/2023 | Qian et al. |
| 2023/0039743 | A1 | 2/2023 | Hui et al. |
| 2023/0072672 | A1 | 3/2023 | Chen et al. |
| 2023/0104257 | A1 | 4/2023 | Barsukou et al. |
| 2023/0105699 | A1 | 4/2023 | Chen et al. |
| 2023/0127983 | A1 | 4/2023 | Chen et al. |
| 2023/0188896 | A1 | 6/2023 | Barsukou |
| 2023/0234837 | A1 | 7/2023 | Chen et al. |
| 2023/0239641 | A1 | 7/2023 | Chen et al. |
| 2023/0303387 | A1 | 9/2023 | Barsukou |
| 2024/0098426 | A1 | 3/2024 | Barsukou |

FOREIGN PATENT DOCUMENTS

| | | |
|---|---|---|
| JP | 2008118639 A | 5/2008 |
| JP | 2019140638 A | 8/2019 |
| KR | 101058475 B1 | 8/2011 |
| WO | 2010003887 A1 | 1/2010 |

OTHER PUBLICATIONS

Chen et al. "Acoustic Transducers Built on Edge-released MEMS Structures," Solid-State Sensors, Actuators, and Microsystems Workshop Hilton Head Island, South Carolina, Jun. 6-10, 2010, pp. 234-237.

Chen et al., "Edge-released, piezoelectric MEMS acoustic transducers in array configuration," J. Micromech. Microeng. 22 (2012) 025005, pp. 1-9.

Huang et al., "High Sensitivity and High S/N Microphone Achieved by PZT Film with Central-Circle Electrode Design", IEEE, MEMS 2017, Las Vegas, NV, USA, Jan. 22-26, 2017, pp. 1188-1191.

Je et al., "In situ tuning of a MEMS microphone using electrodeposited nanostructures," Journal of Micromechanics and Microengineering, 19 (2009) 035015, pp. 1-8.

Je et al., "MEMS Capacitive Microphone with Dual-Anchored Membrane", Proceedings 2017, 1, 342; Aug. 9, 2017.

Littrell, "High Performance Piezoelectric MEMS Microphones", A dissertation submitted in partial fulfillment of the requirements for the degree of Doctor of Philosophy (Mechanical Engineering) in The University of Michigan, 2010, 111 pages.

Lo et al., "Development of a No-Back-Plate SOI MEMS Condenser Microphone," IEEE, Transducers 2015, Anchorage, Alaska, Jun. 21-25, 2015, pp. 1085-1088.

Lo et al., "Sensitivity Improvement of No-Back-Plate MEMS Microphone Using Polysilicon Trench-refilled Process," EEE, Transducers 2017, Kaohsiung, Taiwan, Jun. 18-22, 2017, pp. 1171-1174.

Mohamad et al., "Modelling and Optimisation of a Spring-Supported Diaphragm Capacitive MEMS Microphone", Engineering, 2010, 2, 762-770.

Peña-García et al., "Design and Modeling of a MEMS Dual-Backplate Capacitive Microphone with Spring-Supported Diaphragm for Mobile Device Applications," Sensors (2018), 18, 3545, 30 pages.

Pulskamp et al. "Mitigation of residual film stress deformation in multilayer microelectromechanical systems cantilever devices." Journal of Vacuum Science & Technology B: Microelectronics and Nanometer Structures Processing, Measurement, and Phenomena 21.6 (2003): 2482-2486.

Segovia-Fernandez et al., "Monolithic Piezoelectric Aluminum Nitride MEMS-CMOS Microphone", IEEE (2017), Transducers 2017, Kaohsiung, Taiwan, Jun. 18-22, 2017, pp. 414-417.

Shah et al., "Design Approaches of MEMS Microphones for Enhanced Performance", Hindawi, Journal of Sensors, vol. 2019, Article ID 9294528, Mar. 6, 2019, 26 pages.

Udvardi et al., Spiral-Shaped Piezoelectric MEMS Cantilever Array for Fully Implantable Hearing Systems. Micromachines (2017) 8, 311, 13 pages.

Williams et al., "An AlN MEMS Piezoelectric Microphone for Aeroacoustic Applications", Journal of Microelectromechanical Systems, vol. 21, No. 2, Apr. 2012, pp. 270-283.

Yamashita et al., "Diaphragm deflection control of piezoelectric ultrasonic microsensors for sensitivity improvement", Sensors and Actuators A 139 (2007), pp. 118-123.

Yan et al., "Corrugated Diaphragm for Piezoelectric Microphone", IEEE, 1996, pp. 503-506.

\* cited by examiner

A —

201 211 218

216

214 212 214 213

218

205 y

201

A —

301    311    318

316

314    312    314    313

318    y

301

STEP 3

STEP 2

STEP 1

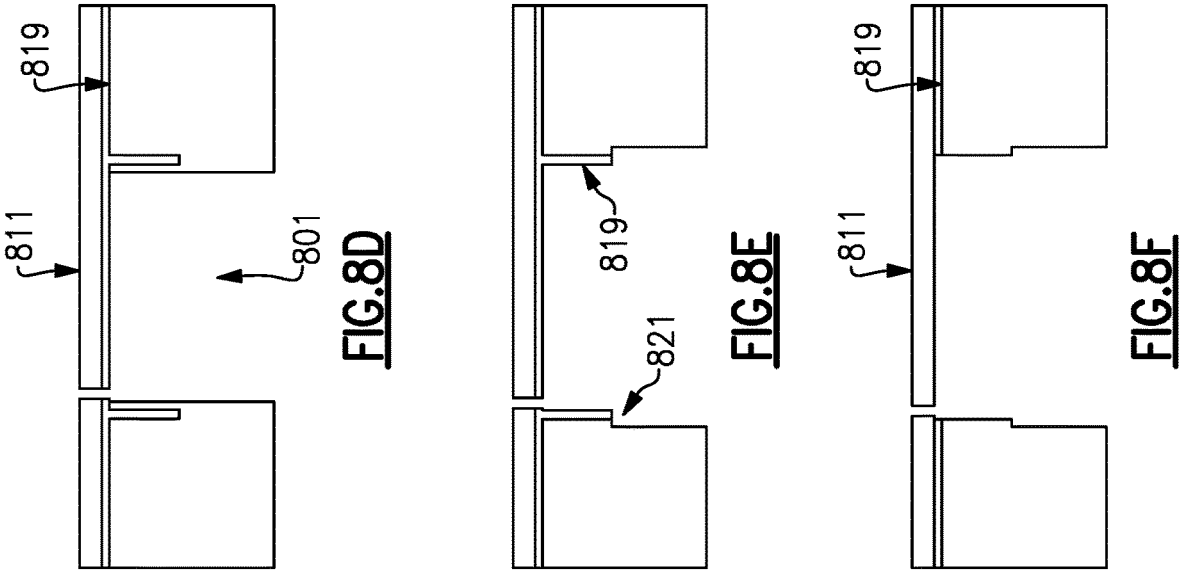
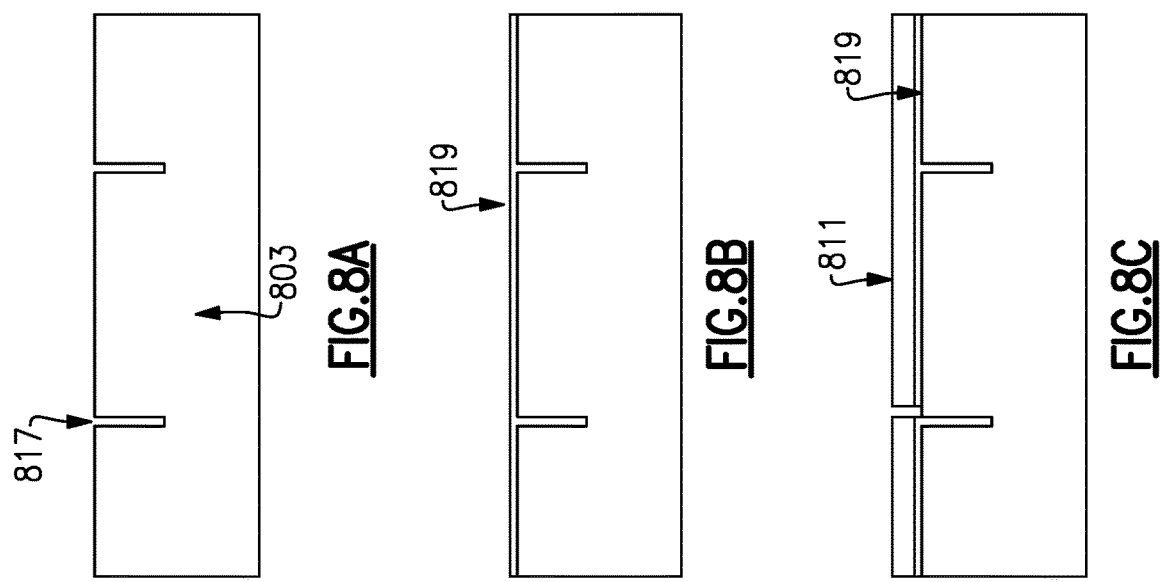

CANTILEVERED PIEZOELECTRIC MICROELECTROMECHANICAL SYSTEMS MICROPHONE WITH STRESS COMPENSATION

CROSS-REFERENCE TO RELATED APPLICATIONS

This application claims priority under 35 U.S.C. § 119(e) to U.S. Provisional Patent Application Ser. No. 63/220,031, titled "CANTILEVERED PIEZOELECTRIC MEMS MICROPHONE," filed Jul. 9, 2021, the entire contents of which being incorporated herein in its entirety for all purposes.

BACKGROUND

Field

The present disclosure relates to a piezoelectric microelectromechanical systems (MEMS) microphone, and in particular a piezoelectric MEMS microphone with a cantilever beam MEMS structure.

Description of the Related Technology

A MEMS microphone is a micro-machined electromechanical device used to convert sound pressure (e.g., voice sound) to an electrical signal (e.g., voltage). MEMS microphones are widely used in wireless devices, mobile devices, headsets, earpieces, speakers and other voice-interface devices or systems. Conventional capacitive MEMS microphones suffer from high power consumption (e.g., large bias voltage) and reliability, for example when used in a harsh environment (e.g., when exposed to dust and/or water).

Piezoelectric MEMS microphones have been used to address the deficiencies of capacitive MEMS microphones. Piezoelectric MEMS microphones offer a constant listening capability while consuming almost no power (e.g., no bias voltage is needed), are robust and immune to water and dust contamination. Piezoelectric film is commonly made from deposition which suffers from large residual stress after deposition which results in sensitivity degradation and variation.

The cantilever beam MEMS structure suffers from poor low-frequency roll-off control as the gap between cantilevers varies due to cantilever deflection induced by residual stress. Additionally, the cantilever MEMS structure can have a complex structure that results in higher manufacturing costs and poor reliability performance.

Cantilevers in MEMS structures are commonly manufactured using physical vapor deposition (PVD) to provide the desired piezoelectric properties of the material, due to the low deposition temperatures, and the large degree of control over the process environment. The commonly used piezoelectric material is Aluminum Nitride (AlN). However, the low temperatures of PVD results in AN films with high intrinsic stress gradients and thus results in a high bend of the cantilever.

SUMMARY

According to one embodiment there is provided a piezoelectric microelectromechanical systems microphone. The piezoelectric microelectromechanical systems microphone comprises a substrate having including walls defining a cavity and at least one of the walls defining an anchor region, a piezoelectric film layer supported by the substrate at the anchor region such that the piezoelectric film layer is cantilevered, the piezoelectric film layer being formed by deposition to introduce differential stress between a front surface of the piezoelectric film layer oriented away from the cavity and a back surface of the piezoelectric film layer oriented towards the cavity such that the piezoelectric film layer is bent into the cavity, and an electrode disposed over the piezoelectric film layer and adjacent the anchor region.

In one example the microphone optionally further comprises a second piezoelectric film layer. This has the advantage that the piezoelectric layers may have different average stresses, such that they may be chosen to compensate for intrinsic stress gradients formed during manufacture.

In one example one of the two piezoelectric film layers has an average stress of −125 MPa and the other piezoelectric film layer has an average stress of 300 MPa. This combination of layers may result in an optimal differential stress.

In one example the piezoelectric film layer and the second piezoelectric film layer and the second piezoelectric film layer have different average stresses to provide the differential stress. This has the advantage that stress compensation techniques may be used to counteract the intrinsic stress gradient introduced during manufacture In one example the piezoelectric film layer optionally has a mean bend of 10 micrometers into the cavity. The bend of a cantilever can in some embodiments be controlled within 20 micrometers, i.e., to ±10 micrometers. Therefore, a cantilever with an average bend of 10 micrometers into the cavity ensures that the cantilever never bends out of the cavity, which would result in a significant decrease in sensitivity.

In one example the piezoelectric film layer is optionally 300-500 micrometers in length. In one example the microphone optionally further comprises a second electrode disposed under the piezoelectric film layer. This has the advantage that one additional electrode results in the energy being created by both the tensile and compressive stresses being converted to voltage. For example, if the piezoelectric film layer bends out of the cavity, the cavity side surface of the piezoelectric film layer will have tensile stress and create energy due to the piezoelectric effect. The surface of the piezoelectric film layer on the side away from the cavity will have compressive stress, and create energy due to the piezoelectric effect.

In one example the microphone optionally further comprises a third electrode disposed between the piezoelectric film layer and the second piezoelectric film layer. This has the advantage that the third electrode may act as a ground electrode.

In one example the piezoelectric material is optionally aluminum nitride.

In one example the piezoelectric material is optionally scandium-doped aluminum nitride.

According to another embodiment there is provided a method of making a piezoelectric microelectromechanical systems microphone. The method comprises etching a trench in a silicon substrate from a front side, filling the trench with a silicon dioxide and oxidizing a surface of a substrate to form an oxidation layer, applying a piezoelectric film layer over the oxidation layer, etching a gap in the piezoelectric film layer from the front side, etching the silicon substrate from the back side, and etching the silicon dioxide from the back side.

In one example the method optionally further comprises etching a second trench wherein the first and second trenches define the edges of the cavity. This has the advantage that the cavity edges are defined by front etching, and are therefore more accurately etched from the back side, as the silicon cannot be etched wider than the trenches, up to the depth at which the trenches are made perpendicular into the silicon. Optionally the etching of the silicon substrate from the back side is optionally completed in two stages. Optionally the two stages are anisotropic and isotropic silicon etching. This has the advantage that the anisotropic etching is able to create substantially perpendicular etches in the substrate, and the isotropic etching is able to remove large areas of substrate. Therefore, the combination of the two is advantageous.

In one example the method optionally comprises etching two or more additional trenches defining pillars. Optionally the method further comprises oxidizing the pillars. Optionally the etching of the silicon dioxide comprises etching the pillars to form a cavity. This has the advantage that by the use of the silicon dioxide etch from the back side of the substrate, the cavity is accurately aligned with the front side etch.

According to another embodiment there is provided a wireless mobile device. The wireless mobile device comprises one or more antennas, a front end system that communicates with the one or more antennas, and one or more piezoelectric microelectromechanical systems microphones. Each microphone includes a substrate having walls defining a cavity and at least one of the walls defining an anchor region a piezoelectric film layer supported by the substrate at the anchor region such that the piezoelectric film layer is cantilevered, the piezoelectric film layer being formed to introduce differential stress between a front surface of the piezoelectric film layer oriented away from the cavity and a back surface of the piezoelectric film layer oriented towards the cavity such that the piezoelectric film layer is bent into the cavity, and an electrode disposed over the piezoelectric film layer and adjacent the anchor region.

In one example the microphone optionally further comprises a second piezoelectric layer.

In one example the piezoelectric film layer and the second piezoelectric film layer have different average stresses to provide the differential stress.

In one example the piezoelectric film layer optionally has a mean bend of 10 micrometers into the cavity.

In one example the piezoelectric film layer is optionally 300-500 micrometers in length. In one example the microphone optionally further comprises a second electrode disposed under the piezoelectric film layer.

In one example the microphone further comprises a third electrode disposed between the piezoelectric film layer and the second piezoelectric film layer.

In one example the piezoelectric material is optionally aluminum nitride.

In one example the piezoelectric material is optionally scandium-doped aluminum nitride.

In one example the piezoelectric film layer and the second piezoelectric film layer have different average stresses to provide the differential stress.

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures:

FIG. 8A-8F are cross-sectional views a method of manufacturing a piezoelectric microelectromechanical systems microphone according to aspects disclosed herein;

DETAILED DESCRIPTION

Aspects and embodiments described herein are directed to a piezoelectric microelectromechanical systems microphone, method of making a microelectromechanical systems microphone, and a wireless device comprising a microelectromechanical systems microphone for improving sensitivity of the microphone.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms.

Methods of manufacturing cantilever MEMS structures are aimed creating piezoelectric sensors with cantilever beams which are as flat as possible, to reduce cantilever deflection and thus keep the gap between cantilevers as small as possible. To achieve this, techniques manufacture a cantilever from multiple steps of PVD to result in a material with multiple layers, wherein each of the layers has a different average stress to compensate the stress gradient effect on film deflection. However, there is a large variation of stress over the area of the wafer that forms a cantilevered beam, and therefore it is difficult to perfectly compensate the stress gradient in one layer with another at more than a limited location across the wafer. Therefore, there is still a discernible problem with cantilever deflection, and a degraded sensitivity in the microphone, which is exacerbated in a large device, over a long length of cantilever. It should be appreciated, in the embodiments described herein, that the effect that if the gap between the cantilever beams and a cavity is poorly controlled, the sensitivity is affected by reducing acoustic resistance, and degrading the microphone's sensitivity, especially in the low frequency range.

Piezoelectric MEMS Microphone

Figure 1A:
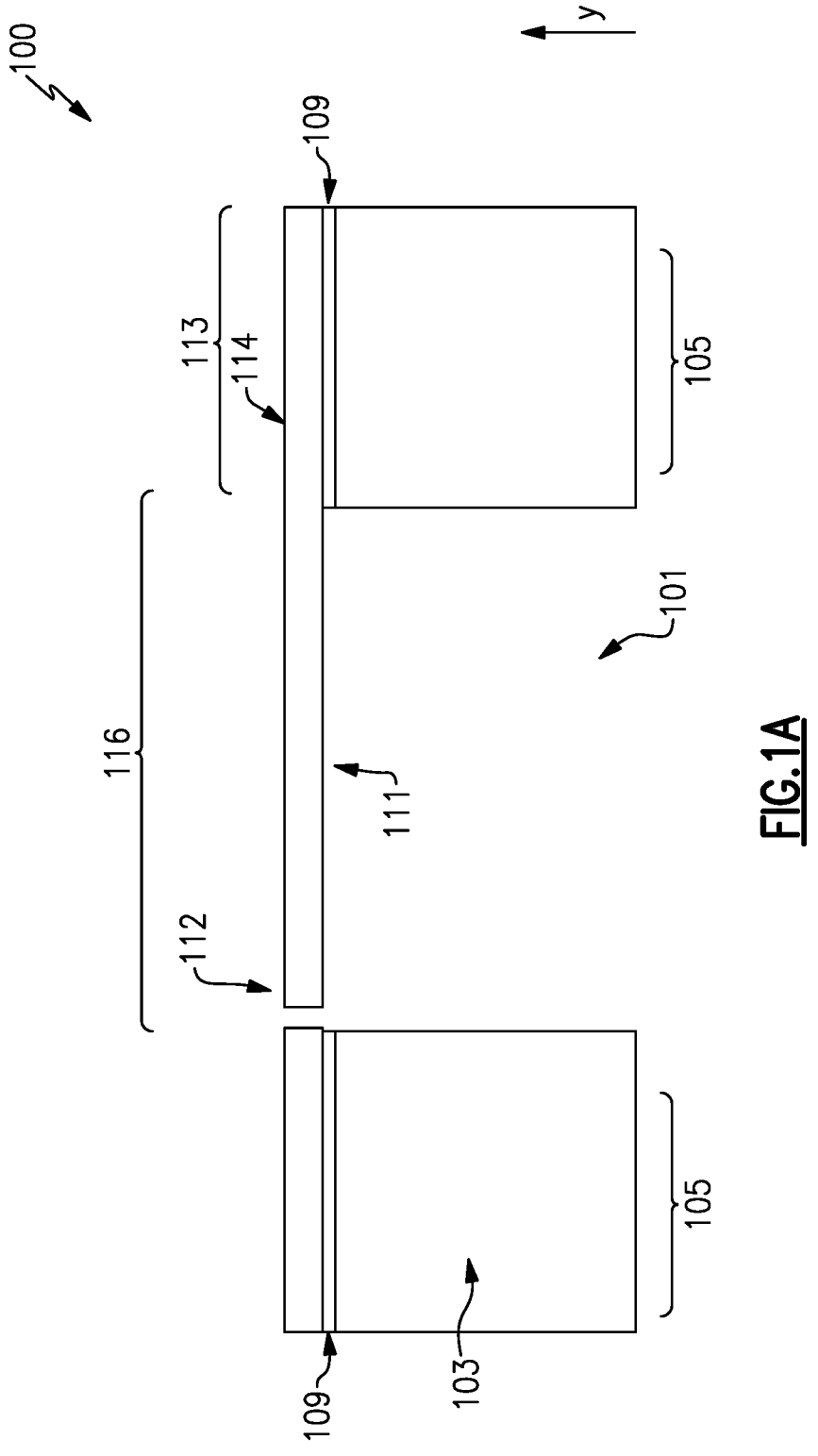
FIG. 1A is a cross-sectional view of a known microelectromechanical systems microphone with a flat cantilevered beam.

FIG. 1A shows a cross-sectional view of one implementation of a piezoelectric microelectromechanical systems (MEMS) microphone 100 (hereinafter the "microphone"). The microphone 100 is a piezoelectric MEMS cantilever microphone. The microphone 100 comprises a substrate 103. The substrate 103 is optionally made of silicon. The substrate 103 has two side walls 105, arranged such that they extend perpendicular to the length of the cantilever. Two further end walls (not shown) complete the cavity on opposite sides, such that they meet the side walls at right angles, and a further structure, described in relation to FIG. 1B later, may be on the underside of the cavity. The walls maybe around 100-500 micrometers thick. A piezoelectric film layer 111 forms a cantilevered beam 116 over the cavity. At least one of the side walls 105 defines an anchor region 113. The anchor region may be around 100-500 micrometers thick. The anchor region 113 is the area where a piezoelectric film layer 111 is coupled to and supported by one of the side walls. The microphone 100 optionally comprises an insulation layer 109 disposed on a surface of the substrate 103. The insulation layer is optionally silicon dioxide. The piezoelectric film layer 111 is supported by the substrate 103 at the anchor region 113, such that the piezoelectric film layer 111 is cantilevered and extends between a fixed end 114 and a free end 112. At least one electrode (not shown) is arranged over the piezoelectric film layer. The arrangement may comprise multiple electrodes arranged over and under the piezoelectric film layer and, in some arrangements, between such layers. Together the piezoelectric film layer(s) and electrode(s) form a cantilevered beam 116. It will be appreciated that although the beam is illustrated as having a rectangular shape in plan view (FIG. 2), other shapes may be used. The microphone 100 comprises at least one electrode which may be disposed over the piezoelectric film layer 111, such that the electrode is located on the cavity side of the piezoelectric layer, or such that the electrode is located on the other side of the piezoelectric layer away from the cavity. The electrode is optionally positioned adjacent the anchor region 113. The insulation layer 109 provides insulation between an electrode, disposed on the cavity side of the piezoelectric film layer, and the silicon substrate 103.

Figure 1B:
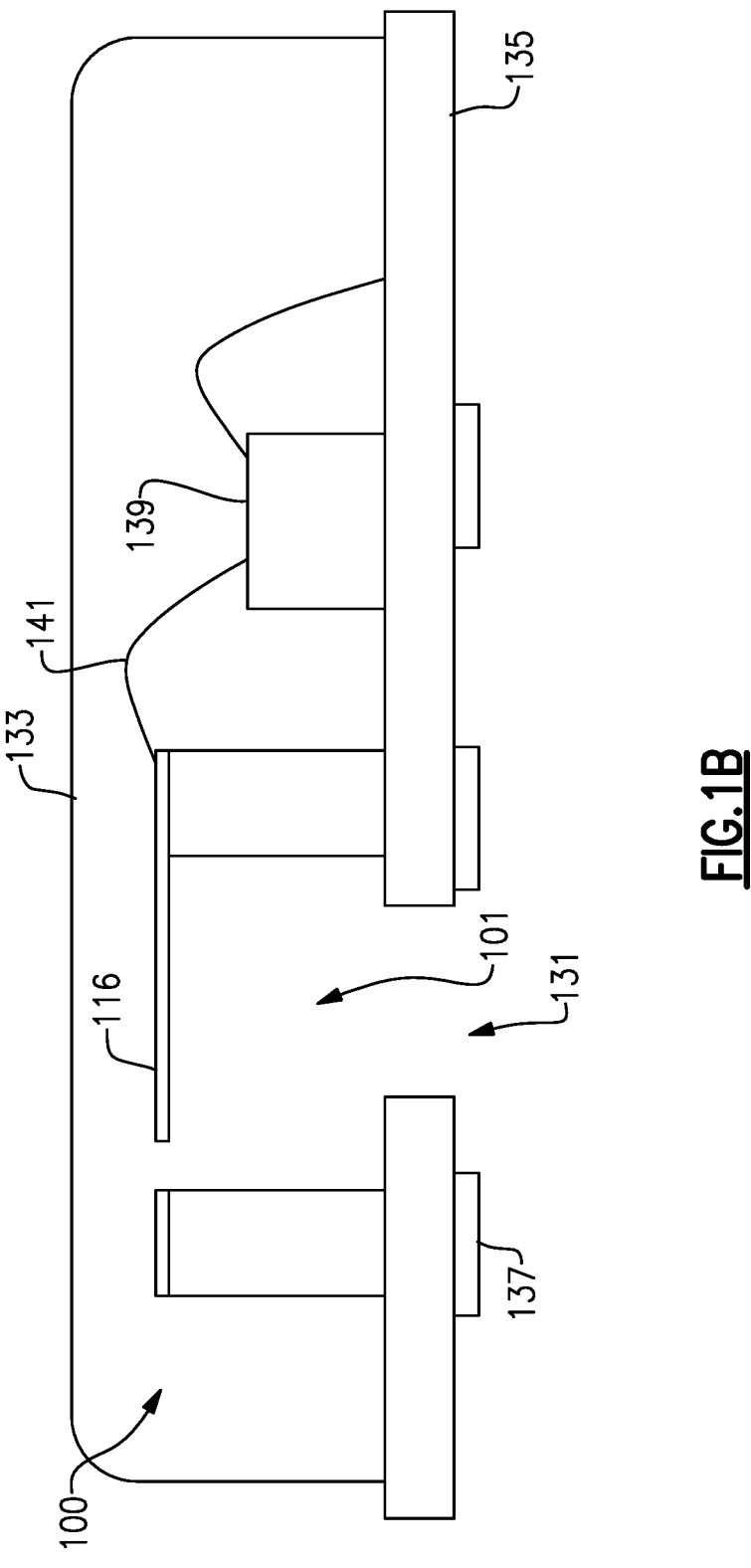
FIG. 1B is a cross-sectional view of a known microelectromechanical systems microphone arrangement.

FIG. 1B illustrates a cross-sectional view of a microphone arrangement. It will be appreciated that this is an example embodiment for illustrative purposes, and the microphone can be included in a variety of different arrangements. As illustrated, the microphone 100 of FIG. 1A is located within a cap 133. The cap may be flexible or rigid, and may be any suitable material such as a metallic material. The cap creates a seal with a substrate 135 (for example, a printed circuit board), such that air only flows into and out of the arrangement via a sound inlet 131. The substrate 135 may be any suitable material. The cap 133 also mitigates electromagnetic interference. Sound waves enter the arrangement, causing the cantilevered beam 116 to bend and produce voltage due to the piezoelectric effect, as described herein. The arrangement comprises at least one solder pad 137 such that the microphone arrangement may be soldered to external devices, not shown here. The microphone arrangement further comprises an application specific integrated circuit chip/die ("ASIC") 139. The MEMS microphone is electrically connected by wire bonding 141. Although not shown, it will be appreciated that the wire bonding may be connected to the one or more electrodes of the microphone, as described herein.

It will be noted that FIG. 1B is a cross-sectional view of the arrangement, such that the one or more solder pads, substrate 135, MEMS microphone 100, ASIC 139, and cap 133 extend into the page such that they are three-dimensional, as described in relation to other embodiments disclosed herein.

Figure 2A:
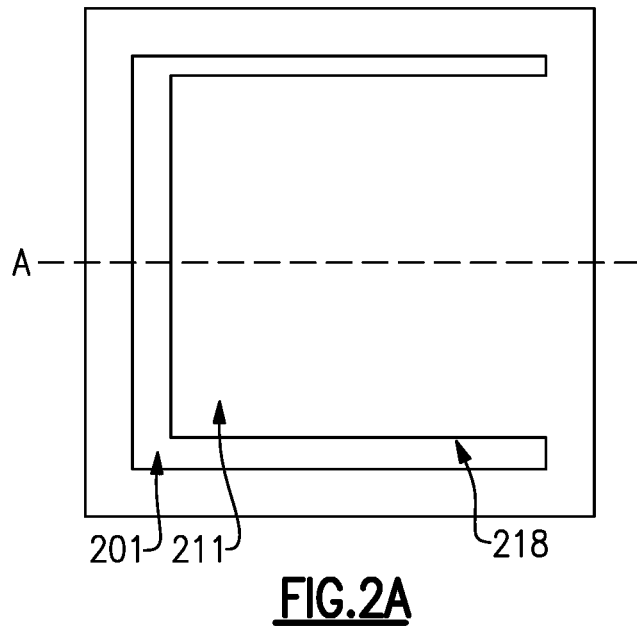
FIG. 2A is a plan view of a known microelectromechanical systems microphone with a flat cantilevered beam.
Figure 2B:
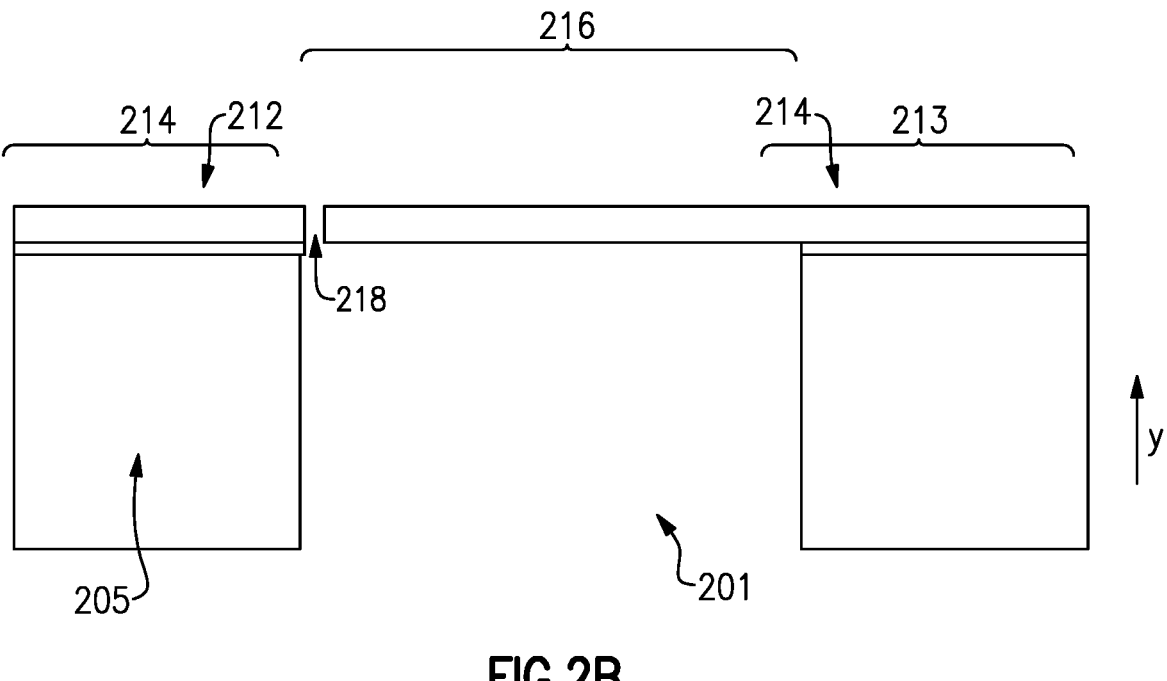
FIG. 2B is a cross-sectional view of a microelectromechanical systems microphone with a flat cantilevered beam of FIG. 2A.

The implementation of FIGS. 2A and 2B show a flat cantilevered beam, illustrating an arrangement in which the cantilevered beam 216 is in line with the side portion 214, located on the cavity wall 205. In this arrangement the gap 218 between the cantilevered beam and cavity is minimized. FIG. 2A shows a plan view from front side to back side of the arrangement of FIG. 1A, such that the cavity 201 can be seen in the gap between the beam and substrate. FIG. 2B is a cross-sectional view along the line A. As described above, the film layer forming the beam 216 is cantilevered, such that it is supported by the anchor region 213 and free to deflect up and down at its free end. It will be appreciated, that for a piezoelectric MEMS microphone, a varying gap between the cantilever and the cavity is disadvantageous due to the variation in air flow into and out of the cavity, and thus a variation in acoustic resistance. An increased gap results in a decreased sensitivity, and therefore it is preferable to make the gap as small as possible.

Figure 3A:
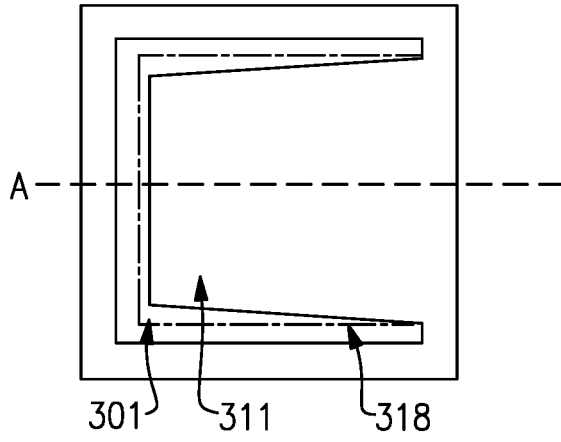
FIG. 3A is a plan view of a microelectromechanical systems microphone with a cantilevered beam bent out of the cavity.
Figure 3B:
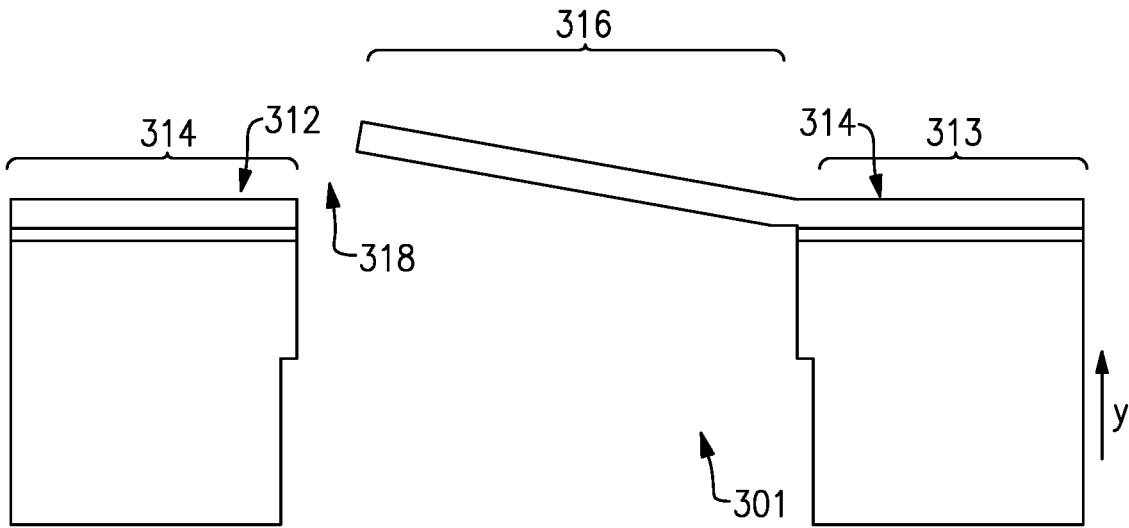
FIG. 3B is a cross-sectional view of a microelectromechanical systems microphone with a cantilevered beam bent out of the cavity of FIG. 2A.

FIGS. 3A and 3B illustrate an arrangement resulting from a high stress gradient in the material, in which the cantilevered beam bends upwards. FIG. 3B shows the cross-sectional view of the cantilevered beam bending upwards, and FIG. 3A illustrates the consequential change in size of the gap between the cantilevered beam and into the cavity, by showing a plan view. The dashed line illustrates the outline of the gap 218 illustrated in the arrangement of FIG.

3A, showing the increase in gap size. The bending of the cantilevered beam upwards arises due to the manufacturing of piezoelectric film layers which is commonly via physical vapor deposition. The manufacturing process introduces a high stress gradient in the material so that the resultant piezoelectric film layer, which forms the cantilevered beam, may not be completely flat. The cantilevered beam may be created using a stress compensation technique, where the cantilevered beam comprises two piezoelectric film layers with different average stress such that their combination results in a cantilevered beam with no stress gradient. The manufacture of such a cantilevered beam typically cannot be precisely controlled. Therefore, a cantilevered beam, manufactured to be flat, may actually bend 10 micrometers upwards out of the cavity as shown. As mentioned above, this gap results in a decrease in sensitivity and an increase in acoustic resistance due to an increase in air flow.

Figure 4:
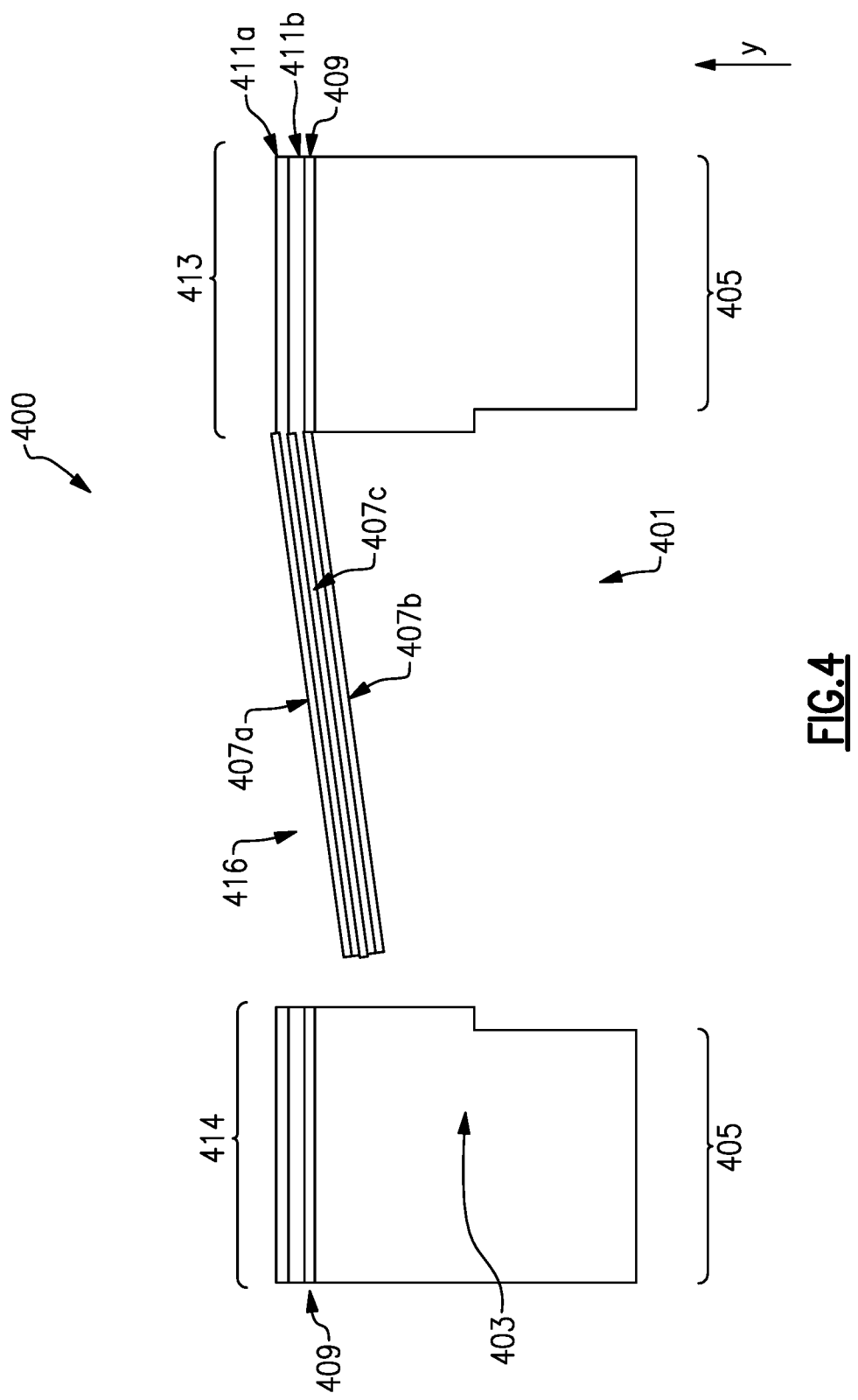
FIG. 4 is a cross-sectional view of a microelectromechanical systems microphone with a cantilevered beam bent into the cavity according to aspects disclosed herein.
Figure 5:
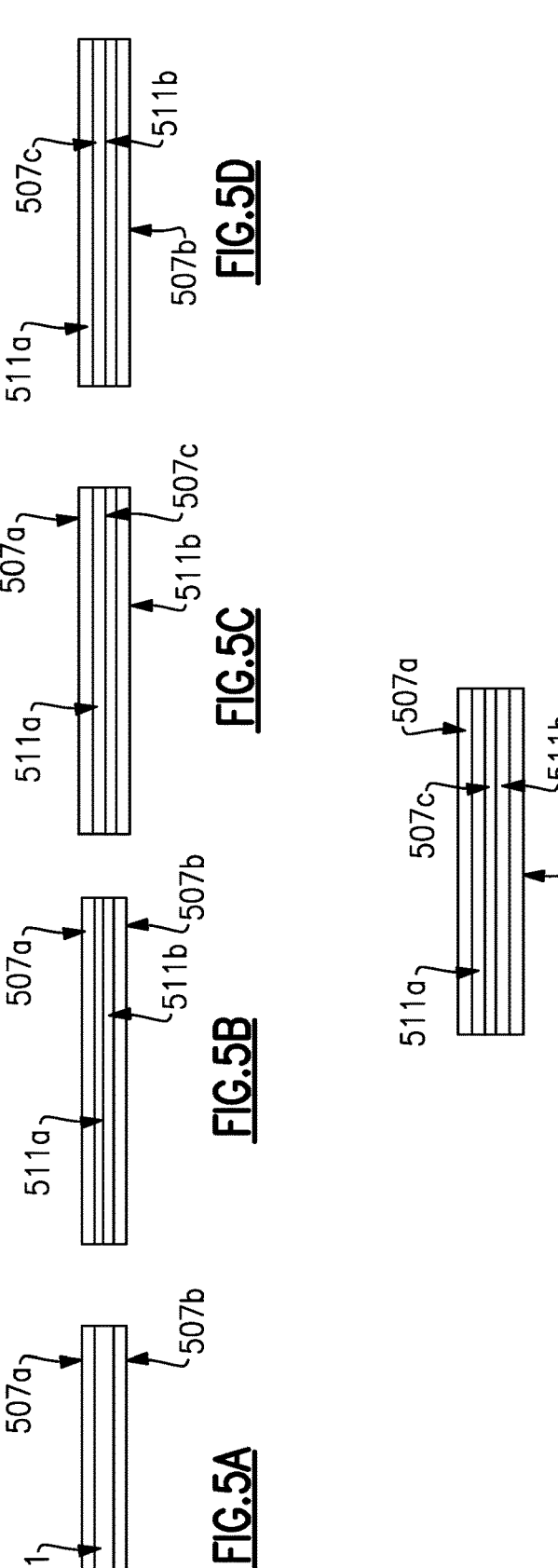
FIG. 5A-5E are cross-sectional views of example arrangements of piezoelectric film layers and electrodes according to aspects disclosed herein.

FIG. 4 shows an embodiment of a microphone as disclosed herein. The embodiment avoids problems with existing arrangements described above. The embodiment makes use of deposition of multiple piezoelectric film layers, with varying average stress to compensate for the stress gradients in the material and to intentionally induce a bend of the cantilever beam 416 slightly into the cavity. The differential stress introduced is thus a differential average stress between a front surface of the piezoelectric film layer oriented away from the cavity and a back surface of the piezoelectric film layer oriented towards the cavity such that the piezoelectric film layer is bent into the cavity to produce an intentional bend. This intentional bend into the cavity ensures that performance of the device is maintained in spite of manufacturing tolerances. The piezoelectric layers may comprise the same material. In the present embodiment the layers are aluminum nitride (AlN), however it will be appreciated that the layers may be different, or may be a material other than AlN. For example, the piezoelectric layers may be scandium-doped aluminum nitride. In the embodiment of FIG. 4, a top 411a layer may be chosen such that its average stress is –125 MPa, and the bottom 411b layer has an average stress of 400 MPa. However, it will be appreciated that a material with other average stress values may be chosen. In the present example, typical fluctuation of stress difference is 50 MPa (±25 MPa) across the wafer, although it will be appreciated that the stress difference may increase due to processing conditions. This stress results in around a ±4 micrometer beam bending for a 300 micrometer long cantilever.

The embodiment as illustrated in FIG. 4, in a cross-sectional view of the device 400, uses similar numbering of features is consistent with the numbering of FIG. 1A. As shown, the cantilevered beam 416, described herein, is manufactured to be bent into the cavity 401. The device comprises some features which are the same as those described in the embodiment of FIG. 1A.

The microphone 400 may comprise four walls, as previously described in relation to FIG. 1A. The microphone may be part of an arrangement as described in relation to FIG. 1B. However, it will be noted that the cavity and cantilevered beam 416 may not have a rectangular cross-section, from the plan view. For example, the cavity and beam 416 may be triangular, such that the cavity comprises three walls around the cavity (i.e., side and/or end walls). Alternatively, the device may comprise four walls (i.e., two side walls and two end walls), which do not meet at right angles, for example the cavity may be a parallelogram. It will be noted that the cantilevered beam, and cavity may have any shape.

The walls are preferably around 100-500 micrometers thick. The cavity may be around 400 micrometers deep.

The cantilevered beam 416 of the microphone, preferably comprises two piezoelectric film layers, 411a and 411b. However, it will be appreciated that the system 400 may comprise any number of piezoelectric film layers, for example, it may comprise only one piezoelectric layer, or it may comprise three or more layers. The piezoelectric film layers, 411a and 411b, may be the same material, or may be different materials. Preferably the piezoelectric film layers are formed from Aluminum Nitride, however it will be appreciated that any suitable piezoelectric material may be used, such as PZT, ZnO, PVDF, PMN-PT, scandium-doped aluminum nitride or others. The two film layers, 411a and 411b, may have different average stress. Optionally, the average stress of one of the layers is –125 MPa, and the average stress of the other layer is 300 MPa, however, it will be appreciated that any average stresses may be chosen. The average stress depends on the properties of the material and may be tuned, for example, the average stress may be tuned by choice of thickness of material, piezoelectric material used, and deposition process parameters. It will be appreciated that these are solely examples and the stress may be tuned by other means. The stress created on the materials can either be tensile, compressive, or tensile and compressive stresses.

In some embodiments, the microphone 400 comprises piezoelectric film layers 411a and 411b. The piezoelectric film layers are manufactured with stresses such that the differential stress between a front surface of the piezoelectric film layer oriented away from the cavity and a back surface of the piezoelectric film layer oriented towards the cavity results in a cantilevered beam bent into the cavity. Using the stress compensation technique, as described above, using the materials and piezoelectric layers with the above mentioned average stress values, one may control the cantilever beam bend within a 20 micrometer range for a cantilever beam with a length of around 300-500 micrometers. Therefore, a cantilever with a mean bend of 0 micrometers may bend ±10 micrometers into or out of the cavity at its free end. Therefore, in the present embodiment, the beam, comprising one or more piezoelectric film layers, is designed such that the free end of the beam is set to be bent 10 micrometers into the cavity rather than setting the cantilever to be flat, where the free end of the beam would be bent 0 micrometers into the cavity. In view of the manufacturing tolerance of ±10, on average this will result in beams that varies from –20 micrometers into the cavity to flat. Accordingly, the likelihood that the beam is bent out of the cavity as in FIGS. 3A and 3B is significantly reduced. The distance measurement into the cavity corresponds to the difference between the height of one surface of the cantilever at the fixed end (in the anchor region), and the height of the same surface at the free end. A negative distance corresponds to a bending into the cavity. It will be noted that other bending techniques may be used to result in a cantilever with a bend into the cavity, such as if different materials with different stresses are used.

The introduction of a beam into the cavity of the present embodiment has an advantage that there is less leakage of air flow into and out of the cavity around the periphery of the beam, than with a cantilever bending out of the cavity. Less leakage of air flow results in a higher sensitivity of the microphone, and the present embodiment enables the device to be designed with a lower frequency cut off. Furthermore, the orientation of the beam being bent into the cavity, results in the walls 405 further confining air flow into the cavity, and thus increasing sensitivity of the system. The microphone 400 of this embodiment comprises three electrodes: a front electrode 407a, a back electrode 407b and a center electrode 407c. The present arrangement comprising three electrodes is advantageous due to one side of the cantilever bending due to tensile stress, and the other due to compressive stress. Electric charge therefore builds on both sides, and the middle electrode can act as a ground electrode. However, it will be appreciated that the microphone may comprise other numbers of electrodes, particularly, it may comprise two electrodes. The center electrode 407c in the illustrated embodiment is located between the first piezoelectric film layer 411a and the second piezoelectric film layer 411b, however it will be appreciated that in an embodiment in which there were three or more layers, or there were fewer electrodes, the arrangement would be varied accordingly. As shown, the piezoelectric film layers are separated from the substrate 403 by an insulating layer 409. The substrate 403 may be silicon and the insulating layer 409 may be silicon dioxide. However, it will be appreciated that the substrate, and thus the insulating layer, may be composed from different materials. The arrangement of electrodes is further described in relation to FIGS. 5A-5E below.

FIGS. 5A-E illustrate the possible arrangements of the piezoelectric film layers with two or three electrodes to form a beam that may be used in the embodiment described above. It will be noted that these arrangements are not limiting, and additional piezoelectric layers and/or additional electrodes may be present in other embodiments, and the arrangement would be varied accordingly, to achieve the same result as described here. It will be noted that although the electrodes are illustrated as being the same shape as the piezoelectric material, such that the electrode covers, or is covered by, the piezoelectric layer, the electrodes may be of a different shape to the piezoelectric layer(s). For example, the one or more electrodes may be located at the free end of the adjacent piezoelectric layer, and/or the one or more electrodes may be located at the center of the adjacent piezoelectric layer, and/or the one or more electrodes may be located at the fixed end of the adjacent piezoelectric layer. These shapes and placements have the result that the electrodes may have a smaller area, and therefore the capacitance may be reduced. The electrode may be shaped such that the tip of the cantilevered beam is exposed, without an electrode located on it. Therefore, the one or more electrodes may only be located adjacent the anchor region, where the stress and strain are highest. It will be noted that the one or more electrodes may be any size, such that their size may be chosen to achieve a desired result.

FIG. 5A illustrates a beam comprising a single piezoelectric film layer 511, a front side electrode 507a, and a back side electrode 507b. FIG. 5B illustrates a beam comprising two piezoelectric film layers 511a and 511b, a front electrode 507a and a back electrode 507b. FIG. 5C illustrates a beam comprising two piezoelectric film layers 511a and 511b, a front side electrode 507a and a middle electrode 507c. FIG. 5D illustrates a beam comprising two piezoelectric film layers 511a and 511b, a middle electrode 507c and a back side electrode 507b. FIG. 5E illustrates a beam comprising two piezoelectric film layers 511a and 511b, a front side electrode 507a, a back side electrode 507b, and a middle electrode 507c.

It will be noted that any suitable conductive material can be used for the one or more electrodes, for example, molybdenum or titanium. It will be appreciated that layers in FIGS. 4 and 5A-5E are for illustrative purposes only and the proportions between components are not to scale. The cantilevered beam may extend between 300 and 400 micrometers in the direction extending across the cavity, as shown in the cross-sectional FIGS. 5A-5E. It will be appreciated that the dimensions of the beam in the direction parallel to the surface of the substrate may be any length.

Figure 6:
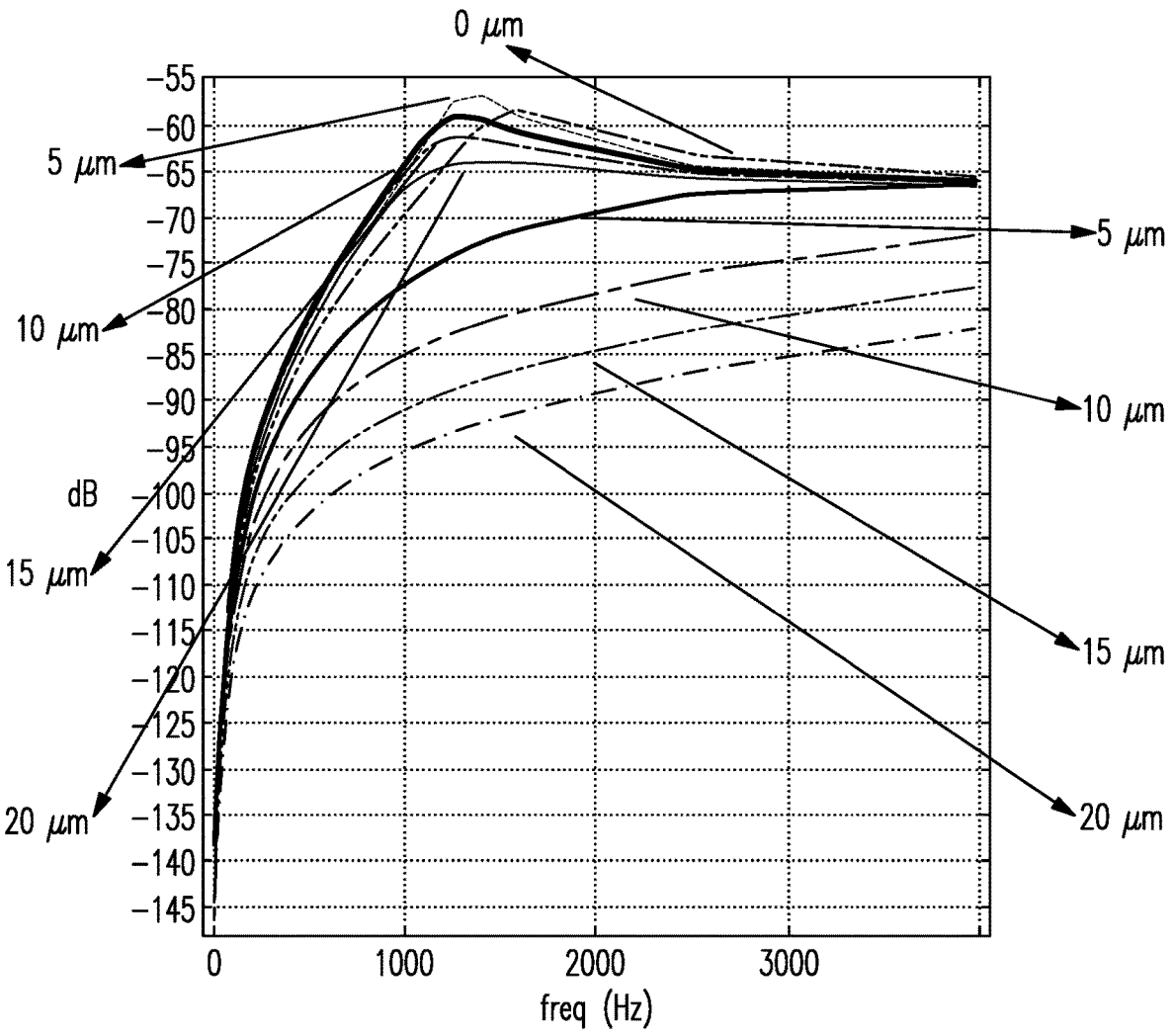
FIG. 6 is a graph of sensitivity against frequency.

FIG. 6 shows a graph of sensitivity against frequency. The labels on the right hand side of the graph relate to the bending of a cantilevered beam away from the cavity, i.e., an arrangement not embodying the invention, and the left hand side relates to the cantilevered beam bending into the cavity, i.e., an embodiment of the invention. The results shown are for 5 micrometer increments from 0 micrometers to 20 micrometers in either direction. As illustrated, the sensitivity decreases with a decrease in frequency, with the decrease being faster at larger bending of the cantilever. As shown, cantilevers bending away from the cavity decrease in sensitivity rapidly when the bending is more than 5 micrometers. Whereas, the sensitivity remains stable up to 20 micrometers of bending into the cavity.

Manufacturing a Piezoelectric MEMS Microphone

Techniques for manufacturing of a piezoelectric MEMS microphone will now be described. It is noted that although this technique is described in relation to the microphone described herein, it is compatible with any piezoelectric MEMS microphones. It will be appreciated that the features of the microphone as described in the above description may be implemented here, such as but not limited to the materials and dimensions.

In the manufacture of a beam for a cantilevered microphone it is necessary to manufacture both the cantilevered beam, and the cavity below this. Disclosed herein are two improved ways in which this may be achieved. An overview of a first method of manufacture is first illustrated in FIGS. 7A-D in which the steps of manufacture are illustrated.

Figure 7D:
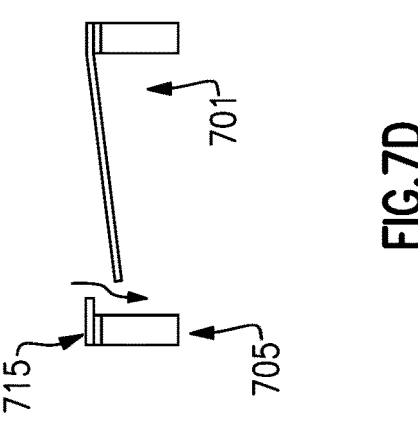
FIG. 7A-7D are cross-sectional views a method of manufacturing a piezoelectric microelectromechanical systems microphone according to aspects disclosed herein.
Figure 7C:
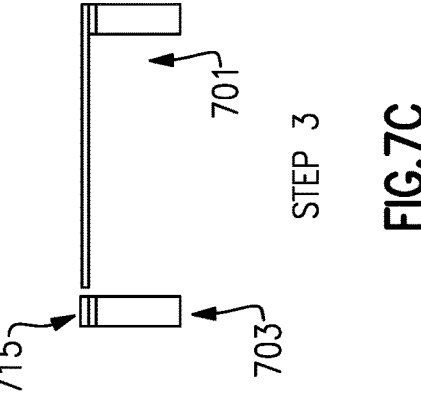
Figure 7B:
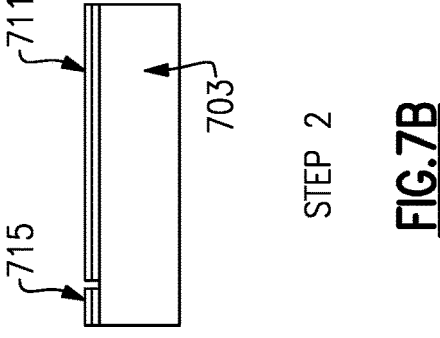
Figure 7A:
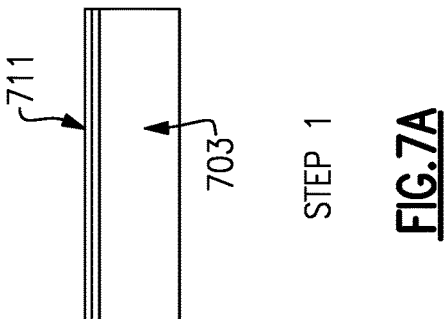

The first step of FIG. 7A illustrates a piezoelectric film layer 711 disposed on a substrate 703. The piezoelectric film layer 711 may be composed of aluminum nitride, however it will be appreciated that any suitable piezoelectric material may be used, such as scandium-doped aluminum nitride. The substrate 703 may be composed of silicon, however it will be appreciated that any suitable material may be used. As illustrated the piezoelectric film layer 711 and substrate 703 are solid in the first step of manufacture.

Step 2, illustrated in FIG. 7B, illustrates the etching of the piezoelectric layer 711. The etch is created from the front side using a dry etching process to create a straight slit in the piezoelectric material, enabling the cantilever to move freely in a direction perpendicular to the surface of the substrate 703.

To create a cavity 701, step 3, illustrated in FIG. 7C, comprises etching a large area from the back side of the substrate 703. This etching process creates the walls of the cavity 705 from the substrate 703.

This first method has disadvantages which can reduce the effectiveness of microphone. These problems arise due to the difficulty of aligning the front etch of the piezoelectric layer with the etch of the cavity from the back. FIG. 7D illustrates an exaggerated view of the mismatch of the cantilever with the cavity created by the etching from the front and back. As shown the etching of the cavity from the back may result in a device in which the cavity wall is not aligned with the residual piezoelectric film layer 715 separate from the cantilever beam, resulting in a larger gap through which the air may flow into the cavity. It is noted that the advantage of a cantilever beam bending into the cavity would be reduced if the bend is too far as illustrated in FIG. 7D, in which the alignment is not sufficiently accurate, as this negatively impacts the sensitivity of the microphone. A method with improved accuracy is desirable, particularly in conjunction with the embodiment in which the cantilever is bending into the cavity.

FIGS. 8A-8F show cross-sectional views of structures illustrating steps of a first improved method of manufacturing a piezoelectric MEMS microphone. It will be appreciated that although described in relation to the embodiment of a beam bending into a cavity, as shown in embodiment 400, the method described herein may be used for the manufacture of any piezoelectric MEMS microphone devices, such as the embodiment in which the beam is flat, or bending out of the cavity (though this is not preferred). It will be noted that the figures are for illustrative purposes only, and the features are not to scale. The cross-sectional view is taken along the line A shown in FIGS. 2A, 3A, 10A and 10B, such that the trenches and cavities as described in the embodiments herein, may be created in any shape in the plane of the surface of the silicon, such as rectangular or triangular.

FIG. 8A shows the step of etching two trenches 817 into a substrate 803, from the front side. The substrate may be silicon, but it will be appreciated that it may be any suitable material. The trenches may be formed perpendicular to the surface of the substrate, such that they extend toward the back of the substrate at an angle substantially 90 degrees from the surface of the substrate. Although shown as a cross-sectional view, it will be noted that in a plan view, the trenches will extend parallel to the surface of the substrate, such that the trenches are rectangular, extending into the page of FIG. 8A. The length of the trenches extending parallel to the surface of the surface may be created such that the resultant cavity may be rectangular, or triangular, or other shapes in plan view. Although not shown here, it will be noted that the two end walls (the walls shown in FIGS. 8A-F and 9A-E are side walls) of the cavity may be formed by etching, and therefore trenches or other suitable methods may be used to form the other two walls. It will be appreciated that to manufacture a rectangular cavity, two additional trenches may be formed perpendicular to those illustrated in FIG. 8A, to create the two end walls. The etching process used to form the trenches may be deep reactive-ion etching (DRIE), an anisotropic etch process, forming walls around 90 degrees to the surface of the substrate. It will be noted that the etching process may be any suitable anisotropic etching process. The trenches may extend around 20 micrometers into the substrate, however it will be noted that the trenches can extend more or less than 20 micrometers into the substrate. The depth of the trenches 817 may be chosen to correspond to a bend of a beam into the cavity. For example, in embodiment 400, in which the beam has a mean bend of 10 micrometers into the cavity, the trenches may be chosen to be 20 micrometers deep to take into account the possible ±10 micrometer error. It will be noted that there can be more than two trenches formed in the substrate.

FIG. 8B shows the step of oxidizing the top layer of the substrate 803 and oxidizing the sections of the substrate 803 that form the walls of the trenches. The trenches may be manufactured to be such a width that the oxidation process forms a sufficient layer of oxide that the trenches are filled with oxide. The oxidation process may include thermal oxidation. In the embodiment in which the substrate is formed from silicon, the oxidized layer 819 will be composed of silicon dioxide. It is noted that the oxidized layer formed will be dependent on the material of the substrate. It will be appreciated that the layer of oxide may be any thickness sufficient to protect the necessary parts from etching in the steps described hereafter.

FIG. 8C shows the step of defining a piezoelectric beam. It will be noted that the cross-sectional view illustrates the beam as two-dimensional, however, the beam extends parallel to the surface of the substrate, such that it is three-dimensional, and may have a rectangular or a triangular cross-section from a plan view. As noted above, the following method may be repeated to define the two end walls, and the other edges of the beam. As illustrated, at least one piezoelectric film layer 811 is formed on the front side of the silicon dioxide layer 819, such that the silicon dioxide 819 layer separates the substrate 803 and the piezoelectric film layer 811. The at least one piezoelectric film layer is formed by a physical vapor deposition. The beam is defined by anisotropic etching of the piezoelectric layer, or layers, and the layer of silicon dioxide 819 on the back side of the piezoelectric material, from the front side of the device. The etch is perpendicular to the surface of the piezoelectric film layer, and it may be around 1 micrometer thick. However, it will be appreciated that the etch may be any thickness suitable for achieving the desired sensitivity. As shown, the etch may be aligned with the inner wall of the trench, such that the beam extends to cover a substantial portion of the cavity, so that, referring to FIG. 4, the beam is coupled to the anchor portion 413 but not the side portion 414. It will be noted that for illustrative purposes additional features in the embodiment, such as electrodes, are not included in the figures. However, it will be noted that these may be deposited on and/or between the piezoelectric layers, during this step. It will be noted that any suitable conductive material can be used for the electrodes, for example, molybdenum or titanium, or others.

FIG. 8D shows the first step of forming the cavity 801. The cavity is etched from the back side of the device, using an anisotropic etch. The cavity is etched by silicon etching, such that the silicon dioxide layer between the beam and substrate is not etched. The cavity etched in this step may be narrower than the width between the two silicon dioxide trenches, so that there is excess silicon on the walls, as shown in FIG. 8D. This first step of etching the cavity defines the depth of the cavity, i.e., it is stopped at the silicon dioxide layer underneath the cavity.

FIG. 8E shows the second step of forming the cavity. In this step an isotropic etch is used to remove excess silicon at the walls of the cavity, but does not etch the silicon dioxide layers. It will be noted that any suitable isotropic etchant may be used. Preferably sulfur hexafluoride ($SF_6$) is used to etch the silicon, as it does not etch silicon dioxide. An isotropic etch results in an etching in all directions, as opposed to the anisotropic etchant. As illustrated in FIG. 8E, the excess silicon located on the inside of the silicon dioxide filled trench 819 is etched away. The upper section of the cavity wall is consequently composed of silicon dioxide. It will be noted that due to the isotropic etching process, the section of the cavity wall not lined with silicon dioxide may be etched, such that a step 821 in the wall may be created.

FIG. 8F shows the final step of the etching process. In this step an isotropic etch is used to remove the silicon dioxide 819 from the cavity wall, and remove the silicon dioxide layer on the cavity side of the piezoelectric film layer. It will be noted that any suitable isotropic etchant may be used. The layer of silicon dioxide located between the piezoelectric film layer 811 and the substrate 803 is not etched away, due to its protection by the remaining silicon, which the silicon dioxide etching does not remove. This remaining layer acts as an insulating layer as described herein. After the removal of the silicon dioxide layer on the cavity side of the beam, the beam will bend about its fixed end according to the stress of the piezoelectric film layer.

It will be appreciated that the cavity created has been accurately aligned with the free end of the cantilevered beam by the lithography from the front side, where the alignment is significantly more accurate. Although a step 821 may be created in the cavity wall, it will be noted that the accuracy of the size of the cavity is only fundamental to the functioning of the device up to the depth to which the beam will bend into the cavity. For example, in the embodiment in which the beam is tuned to bend 10 micrometers into the cavity, with a possible ±10 micrometer variation, the cavity wall accuracy may only be important up to around a depth of 20 micrometers. It will be appreciated, that using the above mentioned technique, the cavity wall can be accurately etched to any depth required. The above mentioned method may be used for the manufacture of any device, especially in an embodiment in which accuracy is preferable to the functioning of the device.

FIGS. 9A-9F show cross-sectional views of structures illustrating steps a second, alternative, improved method of manufacturing a piezoelectric MEMS microphone. It will be appreciated that although described in relation to the embodiment of a beam bending into a cavity, as shown in embodiment 400, the method described herein may be used for the manufacture of any piezoelectric MEMS microphone devices, such as the embodiment in which the beam is flat, or bending out of the cavity. It will be noted that the figures are for illustrative purposes only, and the features are not to scale. As noted in the embodiment illustrated in FIG. 8, although the beam and cavity are shown as two dimensional due to the cross-sectional view of the figure, the beam and cavity are three-dimensional. In FIGS. 9A-E, as in FIGS. 8A-F, the cavity may have any shape in the cross-section of the plan view, and the beam may also have any shape in the cross-section of the plan view.

Figures 9A, 9B, 9C, 9D, 9E:
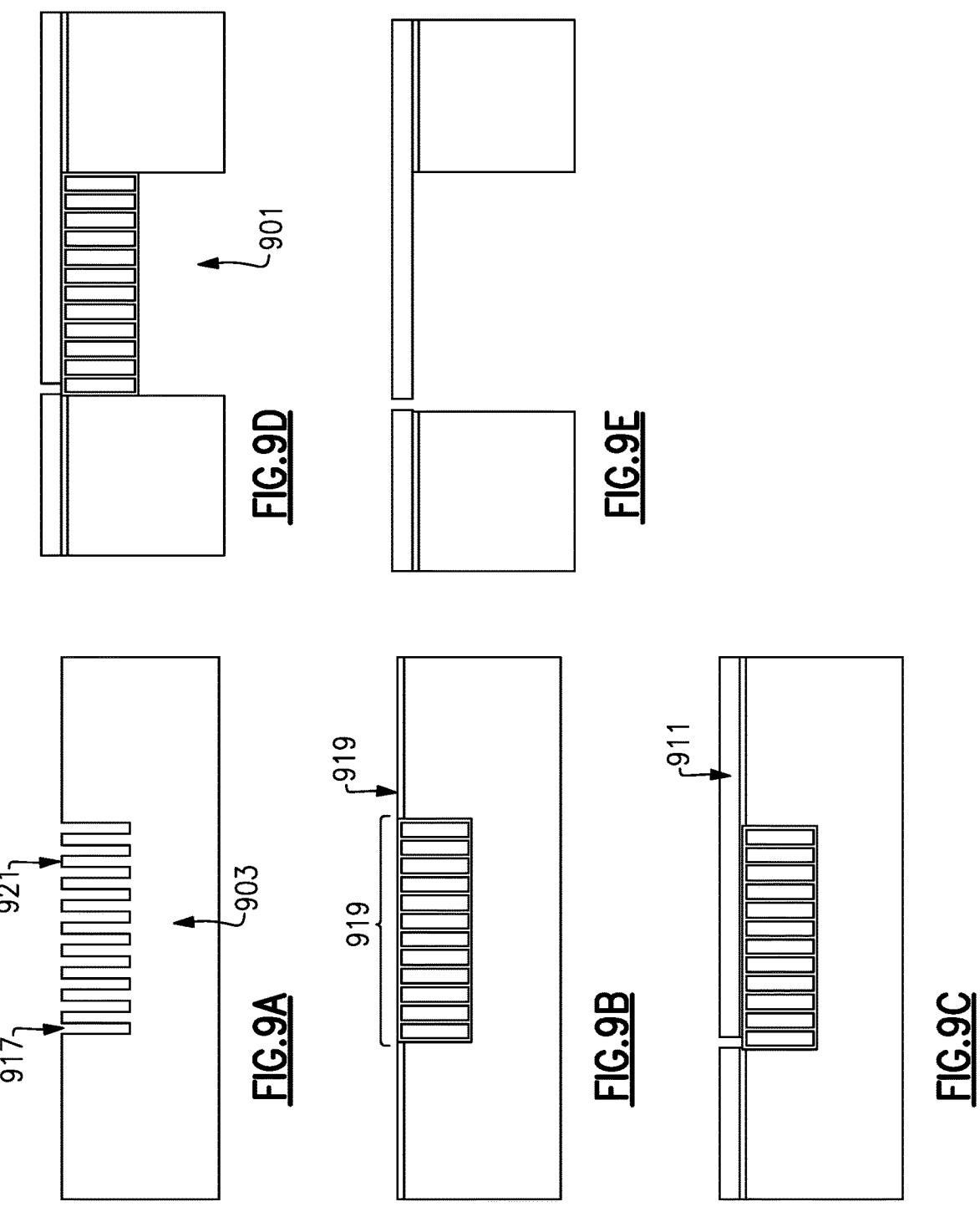
FIG. 9A-9E are cross-sectional views a method of manufacturing a piezoelectric microelectromechanical systems microphone according to aspects disclosed herein.

FIG. 9A shows the step of etching multiple trenches 917 into the substrate 903 from the front side. The steps of forming the trenches described in the present embodiment may be the same as those as described in relation to FIG. 8A. The forming of the trenches creates silicon pillars 921. The trenches 917 and pillars 921 may be the same width, or they may be different widths. It will be noted that although illustrated with ten trenches, any number of trenches may be etched. As noted in relation to the embodiment illustrated in FIGS. 8A-F, the trenches extend parallel to the surface of the substrate, such that the pillars formed in this embodiment will be rectangular in cross-section. The length of each pillar in relation to the others may be chosen such that following their etching, as described herein, will form a cavity of the desired shape.

FIG. 9B shows the step of oxidizing the substrate, including the silicon pillars formed in the method of FIG. 9A. The oxidizing of silicon may include thermal oxidation. The thickness of the pillars are chosen such that the thermal oxidation may consume the entirety of the silicon pillar. After the oxidization process, the trenches are filled with silicon dioxide due to silicon dioxide being grown on the surface of the silicon, and the silicon of the pillars have been oxidized to form pure silicon dioxide. As in FIG. 8B, the surface of the substrate has also been oxidized, such that a layer of silicon dioxide is coating the front side of the device.

FIG. 9C shows the defining of the beam. This process is the same as the process described in relation to FIG. 8C. The etch of the piezoelectric layer 911, or layers, and the layer of silicon dioxide 919 located between the layers and the substrate, is aligned with the outer wall of the leftmost or rightmost trench of the group of trenches. This results in a minimal gap between the resultant cavity wall and the free end of the cantilevered beam.

FIG. 9D shows the etching of the silicon substrate to form a cavity. It will be noted that although illustrated as forming two cavity side walls, the process will also form two end walls, such that the resultant cavity has four walls. The etching process to remove the silicon may be anisotropic etching, preferably it is Deep Reactive Ion Etching (DRIE). The cavity walls are created by the etching to preferably be perpendicular to the front side surface of the device. The walls are created to be substantially aligned with the front side etch of the beam. However, it will be noted that as the trenches may be around 20 micrometers deep, in the embodiment in which the beam is tuned to bend a mean of 10 micrometers into the cavity, and therefore may bend up to 20 micrometers into the cavity, some misalignment of the cavity walls created by this step of etching will not affect the microphone.

FIG. 9E shows the removal of the silicon dioxide from the back side of the device. The method for removing the silicon dioxide is the same as described in the embodiment of FIG. 8E. This etching removes the silicon dioxide on the back side of the beam, and the silicon dioxide formed from the trenches and pillars.

The method of FIGS. 9A-9E as described above provides an advantage of requiring a smaller volume of silicon to be etched, also giving an extra degree of freedom to the etching. Although more silicon dioxide is required to be removed by the isotropic silicon dioxide etch in the method of FIGS. 9A-9E, silicon dioxide etching is a fast process.

The method illustrated in FIGS. 9A-9E results in an accurately aligned free end of the cantilevered beam with the cavity. The etching of the trenches from the front side results in the walls of the cavity being defined from the front side, as well as the beam being defined from the front side. For the device of the embodiment of FIG. 4 to achieve the best sensitivity, the alignment of the free end of the beam and the wall of the cavity should be as accurately aligned as possible, resulting in a minimized gap for air to flow into and out of the cavity. Both the etching of the trenches and the gap to define the beam is done by lithography, resulting in a more accurate alignment, due to the etching being of a smaller magnitude than the etching process used in to etch the cavity from the back side. The present embodiment has resulted in the etching from the back side, in the 20 micrometers from the surface of the substrate, being controlled by the silicon dioxide formed from the pillars and in the trenches.

Figure 10B:
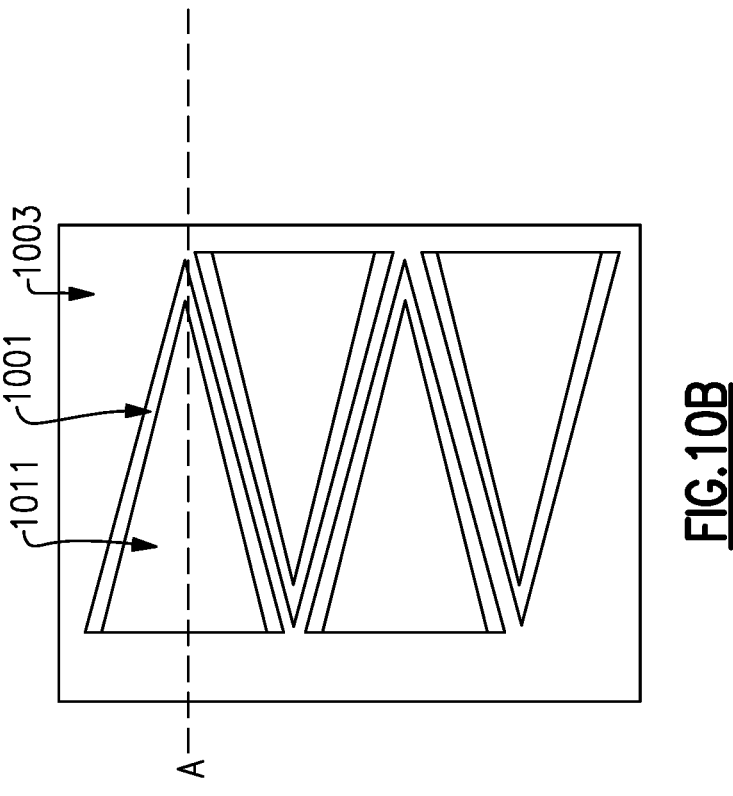
FIGS. 10A and 10B are plan views of arrangements of cantilevered beams and cavities according to aspects disclosed herein.
Figure 10A:
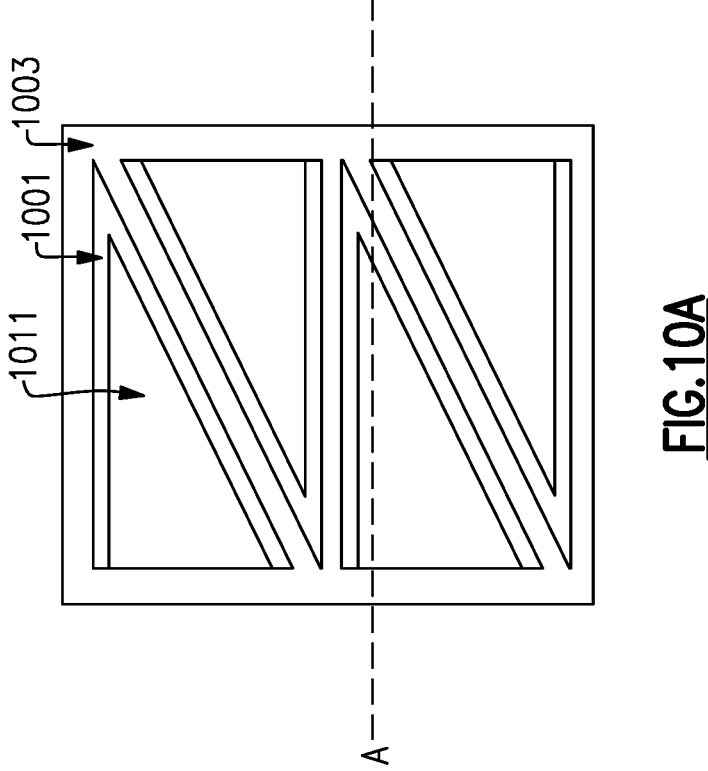

It will be noted that the piezoelectric MEMS microphone devices described herein may comprise beams of any shape. FIGS. 10A and 10B illustrate a plan view of two possible embodiments with different shaped beams. However, it will be noted that the possibilities are not limited to the two embodiments illustrated here. It will also be noted, that although illustrated with four cantilevers, the device may comprise any number of beams.

FIG. 10A shows a first embodiment in which the beams 1011 are right angle triangles, where the triangles correspond such that two or four cantilevers brought together along their hypotenuse form a rectangle. The openings of the cavities 1001 may be the same shape as the beams, such that there may be a consistently sized gap alongside three edges of the cantilever through which air passes into and out of the cavity 1001. The cavities are formed in the substrate such that the cavity walls (as illustrated in the figures described herein, for example, FIGS. 2-4) extend in the plane running into and out of the page, labelled the y-direction in FIGS. 2 and 3. The fourth edge of the cantilever is fixed to a cavity wall of the substrate 1003, such that the free end of the cantilever is free to move in the y-direction, i.e. into and out of the cavity.

FIG. 10B shows a second embodiment in which the cantilevers 1011 are isosceles triangles. The cantilevers are shaped such that two or four beams brought together such that one of the two equal sides of the cantilever are aligned with one of the two equal sides of a neighboring cantilever. However, it will be appreciated that the beams may also be equilateral triangles, and the overall shape of the four triangles will be the same. The beams and cavities have the same features as described in relation to FIG. 10A.

Figure 11:
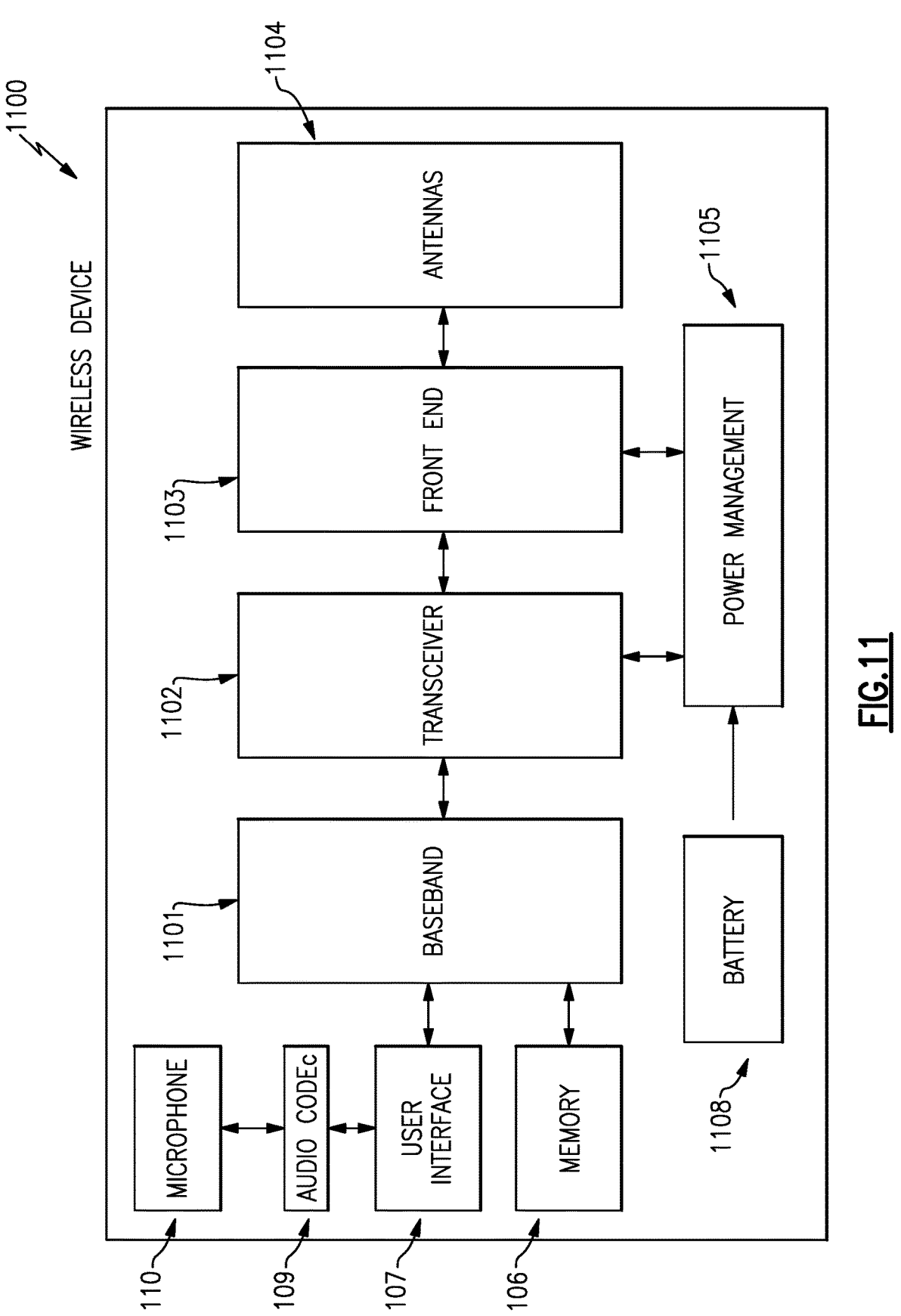
FIG. 11 is a schematic diagram of a wireless device comprising a piezoelectric microelectromechanical systems microphone according to aspects disclosed herein.

FIG. 11 is a schematic diagram of one embodiment of a wireless device 1100. The wireless device can be, for example but not limited to, a portable telecommunication device such as, a mobile cellular-type telephone. The wireless device includes a microphone arrangement 1100, including an improved microphone as described herein in relation to FIGS. 4 to 10, and may include one or more of a baseband system 1101, a transceiver 1102, a front end system 1103, one or more antennas 1104, a power management system 1105, a memory 1106, a user interface 1107, a battery 1108, and audio codec 1109. The microphone arrangement may supply signals to the audio codec 109 which may encode analog audio as digital signals or decode digital signals to analog. The audio codec 1109 may transmit the signals to a user interface 1107. The user interface 1107 transmits signals to the baseband system 1101. The transceiver 1102 generates RF signals for transmission and processes incoming RF signals received from the antennas.

The transceiver 1103 aids in conditioning signals transmitted to and/or received from the antennas 1104.

The antennas 1104 can include antennas used for a wide variety of types of communications. For example, the antennas 1104 can include antennas 1104 for transmitting and/or receiving signals associated with a wide variety of frequencies and communications standards.

The baseband system 1101 is coupled to the user interface to facilitate processing of various user input and output, such as voice and data. The baseband system 1101 provides the transceiver 1102 with digital representations of transmit signals, which the transceiver 1102 processes to generate RF signals for transmission. The baseband system 1101 also processes digital representations of received signals provided by the transceiver 1102. As shown in FIG. 11, the baseband system 1101 is coupled to the memory to facilitate operation of the wireless device.

The memory can be used for a wide variety of purposes, such as storing data and/or instructions to facilitate the operation of the wireless device and/or to provide storage of user information.

The power management system 1105 provides a number of power management functions of the wireless device.

The power management system 1105 receives a battery voltage from the battery 1108. The battery 1108 can be any suitable battery for use in the wireless device, including, for example, a lithium-ion battery.

Embodiments of a piezoelectric microelectromechanical systems microphone are described above. A microphone may also be provided that is manufactured by a method comprising etching a trench in a silicon substrate from a front side, filling the trench with a silicon dioxide and oxidizing a surface of a substrate to form an oxidation layer, applying a piezoelectric film layer over the oxidation layer, etching a gap in the piezoelectric film layer from the front side, etching the silicon substrate from the back side, and etching the silicon dioxide from the back side.

Embodiments of a method of manufacturing a piezoelectric microphone are described above. A method of making a piezoelectric microelectromechanical systems microphone may also be provided that comprises providing a substrate including walls defining a cavity and at least one of the walls defining an anchor region, forming a piezoelectric film layer supported by the substrate at the anchor region such that the piezoelectric film layer is cantilevered, the piezoelectric film layer being formed to introduce differential stress between a front surface of the piezoelectric film layer oriented away from the cavity and a back surface of the piezoelectric film layer oriented towards the cavity such that the piezoelectric film layer is bent into the cavity, and providing an electrode disposed over the piezoelectric film layer and adjacent the anchor region.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. A piezoelectric microelectromechanical systems (MEMS) microphone, comprising:
   a substrate including walls defining a cavity and at least one of the walls defining an anchor region;
   a piezoelectric film layer supported by the substrate at the anchor region such that the piezoelectric film layer is cantilevered, the piezoelectric film layer being formed to introduce differential stress between a front surface of the piezoelectric film layer oriented away from the cavity and a back surface of the piezoelectric film layer oriented towards the cavity such that the piezoelectric film layer is bent into the cavity; and
   an electrode disposed over the piezoelectric film layer and adjacent the anchor region.

2. The piezoelectric MEMS microphone of claim 1 further comprising a second piezoelectric film layer.

3. The piezoelectric MEMS microphone of claim 2 wherein the piezoelectric film layer and the second piezoelectric film layer have different average stresses to provide the differential stress.

4. The piezoelectric MEMS microphone of claim 3 wherein one of the two piezoelectric film layers has an average stress of −125 MPa and the other piezoelectric film layer has an average stress of 300 MPa.

5. The piezoelectric MEMS microphone of claim 1 wherein the piezoelectric film layer has a mean bend of 10 micrometers into the cavity.

6. The piezoelectric MEMS microphone of claim 1 wherein the piezoelectric film layer is 300-500 micrometers in length.

7. The piezoelectric MEMS microphone of claim 1 further comprising a second electrode disposed under the piezoelectric film layer.

8. The piezoelectric MEMS microphone of claim 2 further comprising a third electrode disposed between the piezoelectric film layer and the second piezoelectric film layer.

9. The piezoelectric MEMS microphone of claim 1 wherein the piezoelectric film layer is formed of aluminum nitride.

10. A wireless mobile device comprising:

one or more antennas;

a front end system that communicates with the one or more antennas; and one or more piezoelectric microelectromechanical systems microphones, each microphone including a substrate having walls defining a cavity and at least one of the walls defining an anchor region, a piezoelectric film layer supported by the substrate at the anchor region such that the piezoelectric film layer is cantilevered, the piezoelectric film layer being formed to introduce differential stress between a front surface of the piezoelectric film layer oriented away from the cavity and a back surface of the piezoelectric film layer oriented towards the cavity such that the piezoelectric film layer is bent into the cavity, and an electrode disposed over the piezoelectric film layer and adjacent the anchor region.

11. The wireless mobile device of claim 10 further comprising a second piezoelectric film layer.

12. The wireless mobile device of claim 11 wherein the piezoelectric film layer and the second piezoelectric film layer have different average stresses to provide the differential stress.

13. The wireless mobile device of claim 10 wherein the piezoelectric film layer has a mean bend of 10 micrometers into the cavity.

\* \* \* \* \*